(12) United States Patent
Chan

(10) Patent No.: US 6,518,173 B1
(45) Date of Patent: Feb. 11, 2003

(54) METHOD FOR AVOIDING FLUORINE CONTAMINATION OF COPPER INTERCONNECTS

(75) Inventor: Simon S. Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 3 days.

(21) Appl. No.: 09/640,081

(22) Filed: Aug. 17, 2000

Related U.S. Application Data
(60) Provisional application No. 60/149,435, filed on Aug. 18, 1999.

(51) Int. Cl.[7] .......................................... H01L 21/4763
(52) U.S. Cl. ...................... 438/637; 438/627; 438/628
(58) Field of Search ................................. 438/618–640

(56) References Cited

U.S. PATENT DOCUMENTS

| | | | |
|---|---|---|---|
| 5,055,425 A | 10/1991 | Leibovitz et al. | |
| 5,162,260 A | 11/1992 | Leibovitz et al. | |
| 5,376,235 A | 12/1994 | Langley | |
| 5,635,423 A | 6/1997 | Huang et al. | |
| 6,097,095 A | * 8/2000 | Chung | 257/759 |
| 6,284,657 B1 | * 9/2001 | Chooi et al. | 438/637 |
| 6,372,636 B1 | * 4/2002 | Chooi et al. | 438/639 |

* cited by examiner

*Primary Examiner*—Jey Tsai

(57) ABSTRACT

Corrosion and degradation of tantalum-based adhesion/barrier layers used in multi-level semiconductor devices employing copper-based interconnect metallization systems are avoided or minimized. In embodiments of the present invention, deleterious fluorine-containing contaminants formed on underlying copper-based metal features as a result of etching through-holes in silicon-based interlevel dielectric material layers for via holes is prevented by the use of fluorine-free etching processes. Other embodiments of the present invention include performing a two-step etching sequence comprising a first, fluorine-containing process and a second, fluorine-free process.

7 Claims, 6 Drawing Sheets

ELECTROPLATE Cu

CMP Cu

METHOD FOR AVOIDING FLUORINE CONTAMINATION OF COPPER INTERCONNECTS

CROSS-REFERENCE TO PROVISIONAL APPLICATION

This application claims priority from U.S. provisional patent application Ser. No. 60/149,435 filed Aug. 18, 1999, the entire disclosure of which is incorporated herein by reference.

FIELD OF THE INVENTION

The present invention relates to manufacturing high-density, multi-metal layer semiconductor devices exhibiting reliable electrical interconnections. More particularly, the present invention has particular applicability to multi-level semiconductor devices with design features of 0.25 μm and below, such as 0.18 μm, which devices employ copper or copper-based vias for electrically interconnecting metallization levels vertically spaced apart by dielectric material layers.

BACKGROUND OF THE INVENTION

The present invention relates to a method for performing metallization processing of particular utility in the manufacture of electrical and electronic devices, e.g., circuit boards and semiconductor integrated circuit devices, and is especially adapted for use in multi-level metallization processing utilizing "damascene" type "in-laid" technology and subtractive etching technology.

The escalating requirements for high density and performance associated with ultra-large scale integration (ULSI) semiconductor devices necessitate design features of about 0.25 μm and under, such as about 0.18 μm, increased transistor and circuit speeds, high reliability, and, increased manufacturing throughput. The reduction of design features to about 0.18 micron and under challenges the limitations of conventional interconnection technology, including conventional photolithographic, etching, and deposition techniques.

Semiconductor devices of the type contemplated herein typically comprise a substrate including a semiconductor wafer body, usually of doped monocrystalline silicon (Si) or, in some instances gallium arsenide (GaAs), and a plurality of sequentially formed interlayer dielectrics ("ILDs") and electrically conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced-apart metallization layers or strata are electrically interconnected by vertically oriented conductive plugs filling via holes formed in the ILD separating the layers or strata, while other conductive plugs filling contact area holes establish electrical contact with active device regions, such as source/drain regions of transistors formed in or on the semiconductor body. Conductive lines formed in groove- or trench-like openings in overlying ILDs extend substantially parallel to the semiconductor body. As schematically illustrated in FIG. 1 in cross-sectional view, semiconductor devices of such type fabricated according to current technology may comprise five (5) or more layers or strata of such metallization in order to satisfy device geometry and microminiaturization requirements.

Electrically conductive films or layers of the type contemplated for use in e.g., "back-end" semiconductor manufacturing technology for fabricating devices having multi-level metallization patterns such as described supra, typically comprise a metal such as titanium (Ti), tantalum (Ta), tungsten (W), aluminum (Al), chromium (Cr), nickel (Ni), cobalt (Co), silver (Ag), gold (Au), copper (Cu), and their alloys. In use, each of the enumerated metals presents advantages as well as drawbacks. For example, Al is relatively inexpensive, exhibits low resistivity, and is relatively easy to etch. However, in addition to being difficult to deposit by lower cost, lower temperature, more rapid "wet" type technology such as electrodeposition, step coverage with Al is poor when the metallization features are scaled down to sub-micron size, resulting in decreased reliability of interconnections, high current densities at certain locations, and increased electromigration. In addition, certain low dielectric constant materials, e.g., polyimides, when employed as ILDs, create moisture/bias reliability problems when in contact with Al.

Copper (Cu) and Cu-based alloys are particularly attractive for use in large-scale integration (LSI), very large-scale integration (VLSI), and ultra large-scale integration (ULSI) semiconductor devices requiring multi-level metallization systems for "back-end" processing of the semiconductor wafers on which the devices are based. Cu- and Cu alloy-based metallization systems have very low resistivities, i.e., significantly lower than that of tungsten (W), and even lower than those of previously preferred systems utilizing aluminum (Al) and its alloys, as well as greater resistance to electromigration. Moreover, Cu and its alloys enjoy a considerable cost advantage over a number of the above-enumerated metals, notably silver (Ag) and gold (Au). Also, in contrast to Al and the refractory-type metals (e.g., Ti, Ta, and W), Cu and its alloys can be readily deposited at low temperatures in good quality, bright layer form by well-known "wet" plating techniques, such as electroless and electroplating techniques, at deposition rates fully compatible with device manufacturing throughput requirements.

As indicated above, a commonly employed method for forming metallization patterns as are required for "back-end" metallization processing of semiconductor wafers employs "damascene" (or "in-laid") technology. Generally, in such processing methodology, a recess (i.e., an opening) for forming, e.g., a via hole in an ILD for electrically connecting vertically separated metallization layers, or a groove or trench for a metallization line, is crated in the ILD by conventional photolithographic and etching techniques and then filled with a selected metal. Any excess metal overfilling the recess and/or extending over the surface of the ILD is then removed, as by chemical-mechanical polishing/planarization ("CMP"), wherein a moving pad is pressure-biased against the surface to be polished/planarized, with the interposition of a slurry containing abrasive particles (and other ingredients) therebetween.

A variant of the above-described technique, termed "dual damascene" processing (as, for example, disclosed in U.S. Pat. No. 5,635,423, the entire disclosure of which is incorporated herein by reference), involves the formation of a recess or opening in an ILD which comprises a narrower, lower contact or via hole section, in communication with a wider, upper groove or trench section, which dual function recess is then filled with a conductive material, typically a metal or metal alloy, to simultaneously form a conductive via plug in electrical contact with a conductive line.

Referring now to FIG. 2, schematically shown therein in simplified cross-sectional view, is a conventional damascene-type processing sequence employing low cost, high manufacturing throughput plating and CMP techniques for forming recessed, "back-end" metallization patterns (illustratively of Cu-based metallurgy but not limited thereto) in a semiconductor device formed in or on a semiconductor wafer substrate 1. In a first step, the desired arrangement of conductors is defined as a pattern of recesses 2 such as via holes, grooves, trenches, etc., formed (as by conventonal photolithographic and etching techniques utilizing a fluorine-containing reactive plasma) in the surface 4 of a dielectric material (e.g., a silicon oxide, nitride, or oxynitride, or an organic polymeric material) deposited or otherwise formed over the semiconductor substrate 1. In a second step, a layer 5 of Cu or Cu-based alloy is deposited by conventional plating techniques, e.g., electroless or electroplating techniques, to fill the recesses 2. In order to ensure complete filling of the recesses, the Cu-containing layer 5 is deposited as a "blanket" (or "overburden") layer of excess thickness t so as to overfill the recesses 2 and cover the upper surface 4 of the dielectric layer 3. Next, the entire excess thickness t of the metal blanket or overburden layer 5 over the surface of the dielectric layer 3 is removed by a CMP process utilizing, e.g., an alumina ($Al_2O_3$)-based abrasive slurry, leaving metal portions 5' in the recesses 2 with their exposed upper surfaces 6, substantially co-planar with the surface 4 of the dielectric layer 3.

The above-described conventional damascene metallization process forms in-laid conductors 5' in the dielectric layer 3 while avoiding problems associated with other types of metallization patterning processing, e.g., subtractive etching processing (described below), involving blanket metal layer deposition, followed by photolithographic maskingetching and dielectric gap filling. In addition, such single or dual damascene metallization processing can be performed with a variety of other types of substrates, e.g., printed circuit boards ("PCBs"), with and/or without intervening dielectric layers, and with a plurality of metallization levels, e.g., up to or more than five (5) levels.

By way of illustration, but not limitation, FIG. 3 schematically shows, in simplified cross-sectional view, a damascene processing sequence fully analogous to that shown in FIG. 2, but wherein the sequence of constituent steps is repeated to form a semiconductor device having two (2) vertically separated metallization levels electrically interconnected by a via plug. As illustrated, the device includes a substrate 1S comprised of a semiconductor wafer body 1, overlying dielectric layer 1D, and electrically conductive region 1M extending through dielectric layer 1D for electrically contacting an active device region or component formed on or within wafer body 1D. The device further comprises first and second vertically spaced-apart metallization levels $M_1$ and $M_2$, respectively, electrically interconnected by means of via plug $V_1$, formed by repetition of the basic sequence of steps shown in FIG. 1. FIG. 4 schematically shows, in simplified cross-sectional view, an alternative process sequence for part of the scheme shown in FIG. 3, which alternative sequence employs dual damascene methodology, wherein $V_1$ and $M_1$ are simultaneously formed by forming a recess in $ILD_{2//3}$ having a narrow lower portion and a wider upper portion, and then filling the recess with a suitable electrically conductive material, e.g., a metal or metal alloy.

A significant drawback associated with the use of Cu or Cu-based metallurgy for "back-end" metallization is the possibility of Cu diffusion into adjacent structures, e.g., the underlying semiconductor substrate (typically Si) or an ILD, resulting in degradation of semiconductive or insulative properties, as well as poor adhesion of the deposited Cu or Cu-based alloy layer to various materials employed as ILDs, etc. As a consequence of these phenomena associated with Cu-based metallurgy, it is generally necessary to provide a thin, electrically conductive, adhesion promoting and/or diffusion barrier layer 7 intermediate the semiconductor substrate 1 and the overlying Cu-based metallization layer 5, as schematically indicated in FIG. 5 analogous to FIG. 2. In practice, the adhesion/barrier layer 7, typically comprised of Ti, W, Cr, Ta, and TaN (or composites thereof) in the case of Cu-based metallization, is deposited as to cover the bottoms and interior wall surfaces of the recesses 2, as well as the upper surfaces of dielectric layer 3, with the latter being removed during CMP processing to remove/polish/planarize metallization layer 5. Referring to FIG. 3, a similarly constituted adhesion/barrier layer is similarly applied to each subsequently formed, overlying ILD after patterning for recess formation, in order to line the respective via hole or metallization feature recess with adhesion/barrier layer material prior to filling with Cu or Cu-based metallization.

Another conventional methodology for forming multi-level metallization of semiconductor devices is known as "subtractive etching". According to such methodology, a first dielectric layer is formed on or over a semiconductor substrate, typically a monocrystalline silicon (Si) wafer having conductive contacts formed therein for electrical connection with an active region in or on the substrate, such as a transistor source/drain region. A metal layer is deposited on the first dielectric layer and a photoresist mask having a pattern corresponding to a desired conductive pattern is formed on the metal layer. The metal layer is then etched through the photoresist mask to form the conductive pattern comprising metal features separated by gaps, such as a plurality of metal lines with interwiring spaces therebetween. A second dielectric layer is then applied to the resulting conductive pattern to fill in the gaps and the resulting surface is then planarized, for example, by conventional etching or chemical-mechanical polishing (CMP) techniques.

In a typical subsequent step for forming devices with multiple metallization levels, a through-hole is formed in the first and second dielectric layers to expose a selected portion of an underlying metal feature, such that the exposed portion of the metal feature at the bottom of the through-hole serves as a contact pad. Upon filling the through-hole with conductive material, such as a metal plug, to form a conductive via, the bottom surface of the conductive via is in contact with the underlying metal feature.

As was indicated above, because many large scale (LSI), very large scale (VLSI), and ultra large scale integration (ULSI) devices presently manufactured are very complex and require multiple levels of metallization for the necessary interconnections, it has become common to repeat the above-described process sequence multiple times, e.g., to form five or more levels of metallization interconnected by conductive vias. A semiconductor device of the above-described type including, for illustrative purposes, three levels of Cu-based metallization, and a manufacturing process therefor are explained in more detail below with reference to FIG. 6.

As schematically shown in cross-sectional view in FIG. 6, a multilevel metallization semiconductor device 40 of the above-described type comprises a semiconductor substrate 8, typically a doped monocrystalline silicon wafer, having formed therein or thereon at least one active device region (not shown for illustrative simplicity), e.g., a source/drain region, a bipolar transistor, a diode, and/or other semiconductor elements well known in the art. A first dielectric layer 9 of e.g., a silicon oxide, is formed over substrate 8 and includes at least one electrical contact 10, schematically shown for illustrative purposes, for electrically connecting the active device structure(s) of semiconductor substrate 8 to a first metal feature 11, illustratively of Cu or a Cu-based alloy.

As previously indicated, Cu and Cu-based alloys are preferred materials for use in interconnection metallization structures because of their low cost vis-a-vis other, less common and noble metals (e.g., silver and gold), high conductivity and current-carrying capacity (e.g., even lower than that of aluminum), and very high electromigration resistance. However, as contrasted with e.g., aluminum, copper and copper-based alloys do not bond effectively to the dielectric materials typically employed for vertically spacing apart multiple interconnection metallization levels, e.g., silicon oxides, silicon nitrides, and silicon oxynitrides. In addition, copper tends to undesirably diffuse into underlying Si semiconductor, thereby altering the properties thereof. As a consequence, an electrically conductive adhesion promoting and/or diffusion barrier layer ("adhesion/barrier" layer), typically of Cr, Ta, or a Ta-based material such as an alloy or compound thereof (e.g., TaN), is necessary to be formed intermediate the dielectric layer surfaces and the Cu-based metallization at their mutually contacting positions.

Returning to FIG. 1, first copper-based metal feature 11 ($M_1$) is formed in overlying electrical contact with electrical contact 10 and typically comprises a thin, lower adhesion/barrier layer 11A made of the aforementioned Cr, Ta, or Ta-based material, and a substantially thicker primary conductive layer 11B, of Cu or a Cu-based alloy. After formation of the first metal feature 11, a second dielectric layer 12 (of previously mentioned silicon-oxygen and/or nitrogen containing type), referred to as a "gap-fill" layer, is deposited to fill the interwiring spaces 12A, i.e., the spaces between the first metal features 11. A third dielectric layer 13, also of a Si-based material comprising oxygen and/or nitrogen, is then formed over the second dielectric layer 12 and planarized by conventional techniques, e.g., chemical-mechanical polishing (CMP). A through-hole 14, extending through the second and third dielectric layers 12 and 13, is then formed in accordance with conventional practices, typically reactive plasma etching in an atmosphere including fluorine gas or a fluorine-containing gaseous material. As a result of such through-hole formation, an upper surface portion 11C of the first metal feature 11 ($M_1$) is exposed by and encloses the bottom opening of the through-hole 14, thereby providing a contact pad for a metal plug 15, of Cu or a Cu-based alloy in this instance, forming a first via 16 ($V_1$). Thin layer 17 shown as lining the internal surfaces of the through-hole 14 formed in second and third dielectric layers 12, 13, acts as an electrically conductive adhesion/barrier layer for the Cu-based via plug 15, and as before, may be comprised of Cr, Ta, or a Ta-based material.

Second metal feature 18 ($M_2$), similar to that of first metal feature 11, is then formed by sequentially depositing a composite of thin adhesion/barrier layer 18A and an overlying, thicker Cu-based conductor layer 18B atop the third dielectric layer 13 in vertical registry and in electrical contact with the first metal feature 11 ($M_1$) through Cu-based plug 15 filling first via 16 ($V_1$). Following patterning of the composite, first metal feature 11 ($M_1$) is electrically connected to second metal feature 18 ($M_2$) through first conductive-via 16 ($V_1$).

After formation of the second metal feature 18 ($M_2$), a fourth dielectric layer 19 of dielectric gap-fill material similar to that of second dielectric layer 12 is formed so as to fill the interwiring spaces 19A adjacent the second metal feature 18 ($M_2$). Fifth dielectric layer 20, of a material similar to that of third dielectric layer 13, is then formed over fourth dielectric layer 19 and planarized by such techniques as previously employed with third dielectric layer 13. As before, a through-hole 21 is formed by a reactive plasma etching process employing fluorine gas or a gaseous fluorine-containing compound to extend through fourth and fifth dielectric layers 19, 20 so as to expose a portion 18C of the upper surface of the second metal feature 18 ($M_2$) for serving as a contact pad. Cu or Cu-based plug 22 filling through-hole 21 and constituting a second electrically conductive via 23 ($V_2$) is formed similarly to first via 16 ($V_1$), i.e., by first depositing a layer 24 of adhesion promoting and/or barrier material on the internal surface of the through-hole 21 and on contact pad portion 18C of the second metal feature 18.

As is also illustrated in the figure, a third metal feature 25 ($M_3$), formed of a composite of layers 25A and 25B, fully analogous to layers 11A, 11B, 18A, 18B of the first and second metal features 11 and 18 ($M_1$ and $M_2$) is then formed over fifth dielectric layer 20 and in electrical contact with copper-based plug 22 of via 23 which electrically connects the second and third metal features 18 and 25. Thus, device 40 includes three (3) vertically separated metallization features or levels, $M_1$, $M_2$, and $M_3$, respectively interconnected by two (2) vias, $V_1$ and $V_2$.

The above-described process of metal feature formation, dielectric gap-filling, and via formation may be repeated, as desired, in order to fabricate high-density LSI, VLSI, and ULSI devices with multiple levels of interconnection. Typical devices currently manufactured include up to five (5) levels of such metallization interconnected by vias.

A problem encountered in the formation of such multi-level metallization devices employing metal plug-filled vias, whether formed by means of damascene, in-laid metallization processing or by subtractive etching metallization processing, arises from the use of fluorine-containing materials in the process for etching the silicon oxide, nitride, and/or oxynitride-based gap-fill and/or interlevel dielectric layers for forming through-holes therein defining the vias. Specifically, the surface portions of the metal features thereby exposed at the open bottoms of the through-holes and which form contact pads (e.g., $CP_1$, $CP_2$, and $CP_3$ in FIG. 3 and 11C and 18C in FIG. 6) for the respective metal via plugs or metallization lines are contaminated with a fluorine or fluorine-containing residue from the etching process. Such fluorine or fluorine-containing residue can undesirably attack or corrode the subsequently formed overlying adhesion/barrier layer and/or metal plug or metallization line, thereby resulting in poor quality ohmic contacts, decreased device performance, and unacceptably low reliability.

The above-described drawback resulting from fluorine-containing etchant chemistries typically used with silicon oxide, nitride, and oxynitride dielectric layers occurs with a number of commonly employed interconnection metals or compounds thereof, such as aluminum (Al), titanium (Ti), copper (Cu), molybdenum (Mo), chromium (Cr), palladium (Pd), and titanium nitride (TiN). However, the problem is particularly acute with Cu or Cu-based metallization systems employing Ta or Ta-based electrically conductive adhesion/barrier layer materials (such as, for example, TaN), in view of their increased susceptibility to attack by fluorine and fluorine-containing residues produced during the through-hole or recess etching process.

Thus, there exists a need for an improved method of fabricating multilevel metallization semiconductor devices which substantially reduces, avoids, or eliminates degradation of contact resistance, device performance, and reliability caused by residual fluorine contamination resulting from via processing.

DISCLOSURE OF THE INVENTION

An advantage of the present invention is a method of manufacturing a high-density, multi-metal layer semiconductor device with an improved metallization structure.

Another advantage of the present invention is methods for reducing, avoiding, or eliminating degradation of the properties and characteristics of electrically conductive vias in multi-metal level semiconductor devices.

Still another advantage of the present invention is a multi-level metallization semiconductor device having an improved copper or copper-alloy based via system.

Additional advantages, aspects, and other features of the present invention will be set forth in part in the description which follows and in part will become apparent to those having ordinary skill in the art upon examination of the following or may be learned from the practice of the invention. The advantages and aspects of the invention may be realized and obtained as particularly pointed out in the appended claims.

According to an aspect of the present invention, the foregoing and other advantages are achieved in part by a method of manufacturing a multi-level semiconductor device, which method comprises the sequential steps of:

(a) providing a substrate comprising a semiconductor body and an electrically conductive metal region at a surface of the substrate;

(b) forming a layer of a dielectric material over the substrate surface and covering the metal region;

(c) selectively forming a recess extending through the dielectric layer by use of a dielectric material removal process which is free of fluorine, the recess including interior wall surfaces and a bottom, the bottom exposing a surface portion of the electrically conductive metal region;

(d) forming an electrically conductive adhesion/barrier layer lining the interior wall surfaces and bottom of the recess; and (e) filling the recess with an electrically conductive metal material formed over the adhesion/barrier layer and in electrical contact with the exposed surface portion of the electrically conductive metal region, thereby substantially preventing deleterious effects on the adhesion barrier layer due to the presence of fluorine or fluorine-containing contaminant(s) at the exposed surface portion.

According to an embodiment of the present invention, step (c) comprises selectively forming the recess in the dielectric layer by a fluorine-free process selected from the group consisting of plasma etching, reactive plasma etching, sputter etching, ion beam etching, electron beam etching, laser etching, laser ablation, and wet chemical etching.

According to another aspect of the present invention, a method of manufacturing a multi-level semiconductor device comprises the sequential steps of:

(a) providing a substrate comprising a semiconductor body and an electrically conductive metal region at a surface of the substrate;

(b) forming a layer of a dielectric material the substrate surface and covering the metal region;

(c) selectively forming a recess extending through the dielectric material layer, the recess including interior wall surfaces and a bottom, the bottom of the recess exposing a surface portion of the electrically conductive metal region, the forming of the recess including a first step of completely forming the recess using a dielectric material removal process including fluorine or a fluorine-containing material and a second step of treating the thus-formed recess to remove residual fluorine or fluorine-containing contaminant(s) from the exposed surface portion of the electrically conductive metal region;

(d) forming an electrically conductive adhesion/barrier layer lining the interior wall surfaces and bottom of the recess; and (e) filling the recess with an electrically conductive metal layer formed over the adhesion/barrier layer and in electrical contact with the exposed surface portion of the electrically conductive metal region, thereby substantially reducing deleterious effects on the adhesion/barrier layer due to the fluorine or fluorine-containing contaminant(s).

According to an embodiment of the present invention, step (c) comprises selectively forming the recess in the dielectric material layer by performing the first, recess forming step by use of a wet chemical etching process including a fluorine-containing etchant or by use of a reactive plasma etching process employing fluorine gas or a fluorine-containing gaseous material and performing the second, treating step by exposing the thus-formed recess to a fluorine-free plasma or by sputter etching or cleaning the thus-formed recess in a fluorine-free atmosphere for an interval sufficient to substantially remove fluorine or fluorine-containing contaminant(s) at the exposed surface portion of the electrically conductive region.

In yet another aspect according to the present invention, a method of manufacturing a multi-level semiconductor device comprises the sequential steps of:

(a) providing a substrate comprising a semiconductor body and an electrically conductive metal region at a surface of the substrate;

(b) forming a layer of a dielectric material over the substrate surface and covering the metal region, the dielectric material layer having a prescribed thickness;

(c) selectively forming a recess extending through the dielectric material layer, the recess including interior wall surfaces and a bottom, the bottom of the recess exposing a surface portion of the electrically conductive metal region, the forming of the recess including a first step of partial recess formation by removing a major portion of the prescribed thickness of the dielectric material layer by a removal process including fluorine or a fluorine-containing material and a second, fluorine-free step of removing the remaining minor portion of the prescribed thickness of the dielectric material layer to complete the recess formation, the amount of dielectric material removal in the second step being sufficient to ensure substantially complete removal of fluorine or fluorine-containing contaminant(s) present at the bottom of the partial recess formed in the first step;

(d) forming an electrically conductive adhesion/barrier layer lining the interior wall surfaces and bottom of the recess; and (e) filling the recess with an electrically conductive metal layer formed over the adhesion/barrier layer and in electrical contact with the exposed surface portion of the electrically conductive metal region;

whereby deleterious effects on the adhesion/barrier layer due to the fluorine or fluorine-containing contaminant(s) are substantially reduced.

According to an embodiment of the present invention, step (c) comprises selectively forming the recess in the dielectric material by performing the first, partial recess forming step by use of a wet chemical etching process including a fluorine-containing etchant or by use of a reactive plasma etching process employing fluorine gas or a fluorine-containing gaseous material and performing the second, fluorine-free removing step by exposing the partially formed aperture to a reactive plasma or to a sputter etching process using fluorine-free gases, or to a wet chemical etching using a fluorine-free etchant.

In preferred embodiments according to the present invention, step (a) comprises providing a substrate including a monocrystalline silicon (Si) wafer body and the electrically conductive region comprises copper (Cu) or a Cu-based alloy; step (b) comprises forming the dielectric material layer from a member selected from the group consisting of silicon oxides, silicon nitrides, and silicon oxynitrides; step (c) comprises forming the recess as a via hole for electrically interconnecting vertically spaced-apart metallization levels of the semiconductor device; step (d) comprises forming the electrically conductive adhesion/barrier layer from a material chosen from the group consisting of chromium, tantalum, or a tantalum-based compound or alloy; step (e) comprises filling the recess with Cu or a Cu-based alloy; and steps (b)–(e) form part of a damascene, in-laid metallization process or a subtractive etching metallization process and are repeated, as necessary, for providing a semiconductor device having multiple metallization levels.

Additional advantages and aspects of the present invention will become readily apparent to those skilled in the art from the following detailed description, wherein embodiments of the invention is shown and described, simply by way of illustration of the best mode contemplated for carrying out the method of the invention. As will be realized, the invention is capable of other and different embodiments, and its several details are capable of modifications in various obvious respects, all without departing from the invention. Accordingly, the drawings and description are to be regarded as illustrative in nature, and not as limitative.

BRIEF DESCRIPTION OF THE DRAWINGS

The following detailed description of embodiments of the present invention can best be understood when read in conjunction with the following drawings, wherein.

Figure 1:
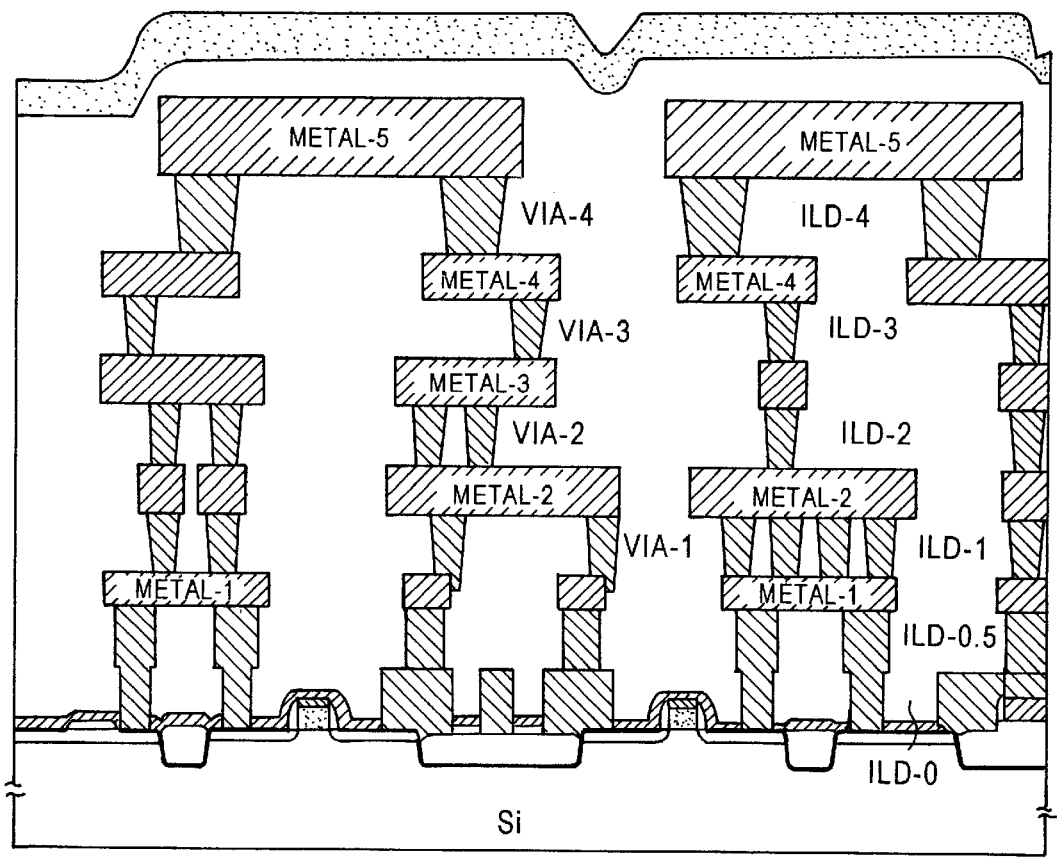
FIG. 1 illustrates, in cross-sectional view, a portion of a multi-metallization layer "back-end" contact/interconnect structure of an integrated circuit semiconductor device fabricated according to the inventive methodology and having a plurality of electrically conductive vias formed therein.
Figure 2:
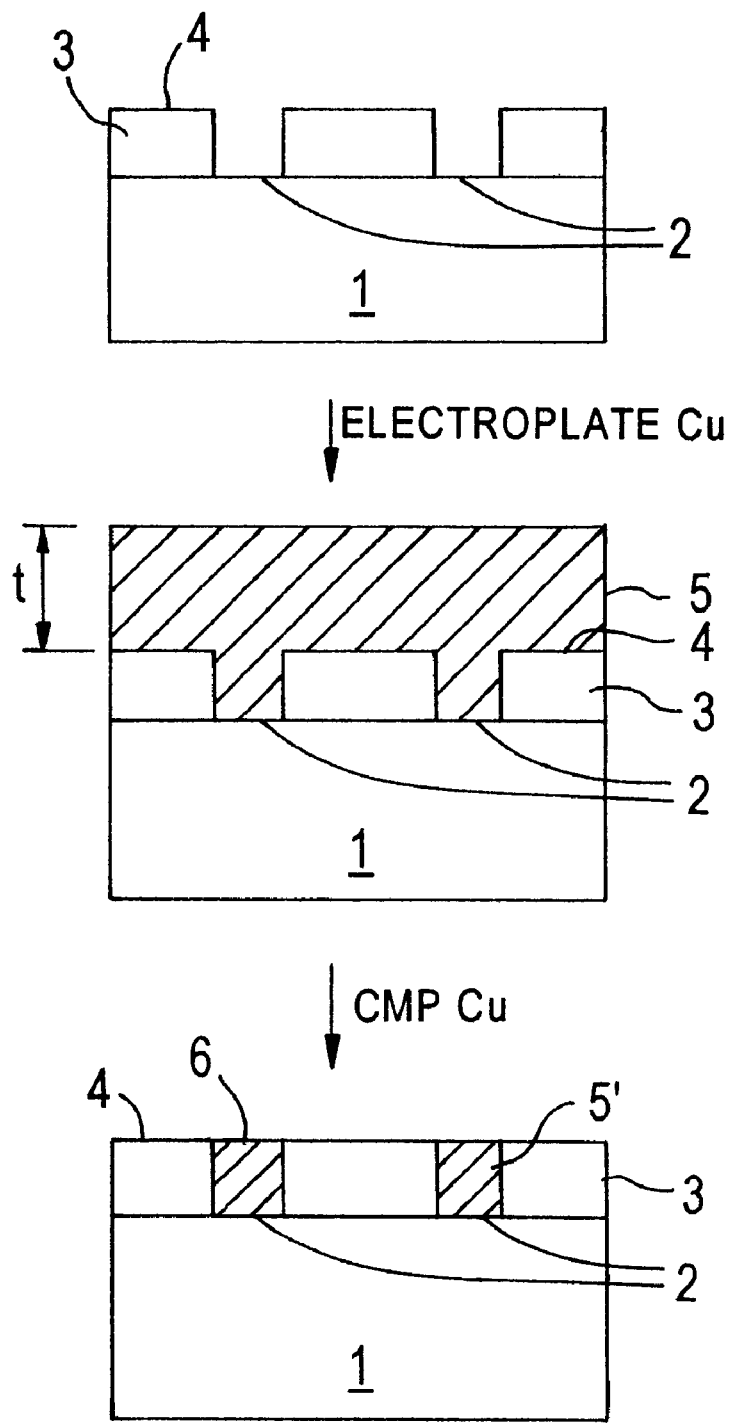
FIG. 2 illustrates, in simplified, cross-sectional schematic view, a sequence of processing steps for forming a pattern of damascene-type, in-laid Cu-based metallization features according to conventional practices for the manufacture of semiconductor integrated circuit devices.

It should be recognized that the process steps and structures shown in the figures and described below do not necessarily form a complete process flow for manufacturing semiconductor devices according to the invention. However, the present invention can be utilized in conjunction with conventional technology currently employed in the art, e.g., integrated circuit fabrication methodology, and consequently, only so much of the commonly practiced process steps are illustrated herein as are necessary for providing an understanding of the present invention. As employed throughout the present disclosure and claims, the term "substrate" includes, e.g., a semiconductor substrate per se (as in wafer form) or an epitaxial layer formed on a suitable semiconductor substrate, and further includes an electrically conductive metal contact region at a surface thereof. Finally, the drawing figures representing cross-sections of portions of a semiconductor device during fabrication processing are not drawn to scale, but instead are drawn as to best illustrate the features of the present invention.

DESCRIPTION OF THE INVENTION

The present invention addresses and solves problems arising from manufacturing electrical and electronic devices having multiple (i.e., vertically separated) levels of metallization patterns electrically interconnected by conductive plugs filling via or through-holes, wherein, as part of the sequence of processing steps, recesses for vias and electrical features of the metallization pattern are formed in a dielectric layer by means of an etching process utilizing a fluorine or fluorine-containing etchant, e.g., reactive plasma etching in fluorine gas or a fluorocarbon gas, and residue from the fluorine-based etching process corrodes the electrical contact and barrier/adhesion layer materials, leading to poor quality ohmic contacts, and decreased device performance and reliability. More specifically, the inventive methodology eliminates, or at least substantially reduces or mitigates the corrosive effect of fluorine and/or fluorine containing residues present in through-holes and recesses formed in dielectric layers in the course of multi-metallization level processing of electrical and electronic devices, e.g., semiconductor integrated circuit devices.

The present invention enables the formation of multi-metallization level semiconductor integrated circuit and other type electrical and electronic devices which are free of the above-described drawbacks and disadvantages associated with conventional damascene-type or subtractive etching-type metallization processing, by means of techniques and instrumentalities which are fully compatible with the requirements of automated manufacturing technology and product throughput. Briefly stated, according to the present invention, a pattern of recesses used for forming via through-holes and/or metallization features such as lines, etc., is formed in a dielectric layer by means of etching methodology which results in substantially complete absence of deleterious fluorine or fluorine-containing residue prior to filling of the through-hole or other shape recess with conductive material, e.g., metal or metal alloy.

Figure 3:
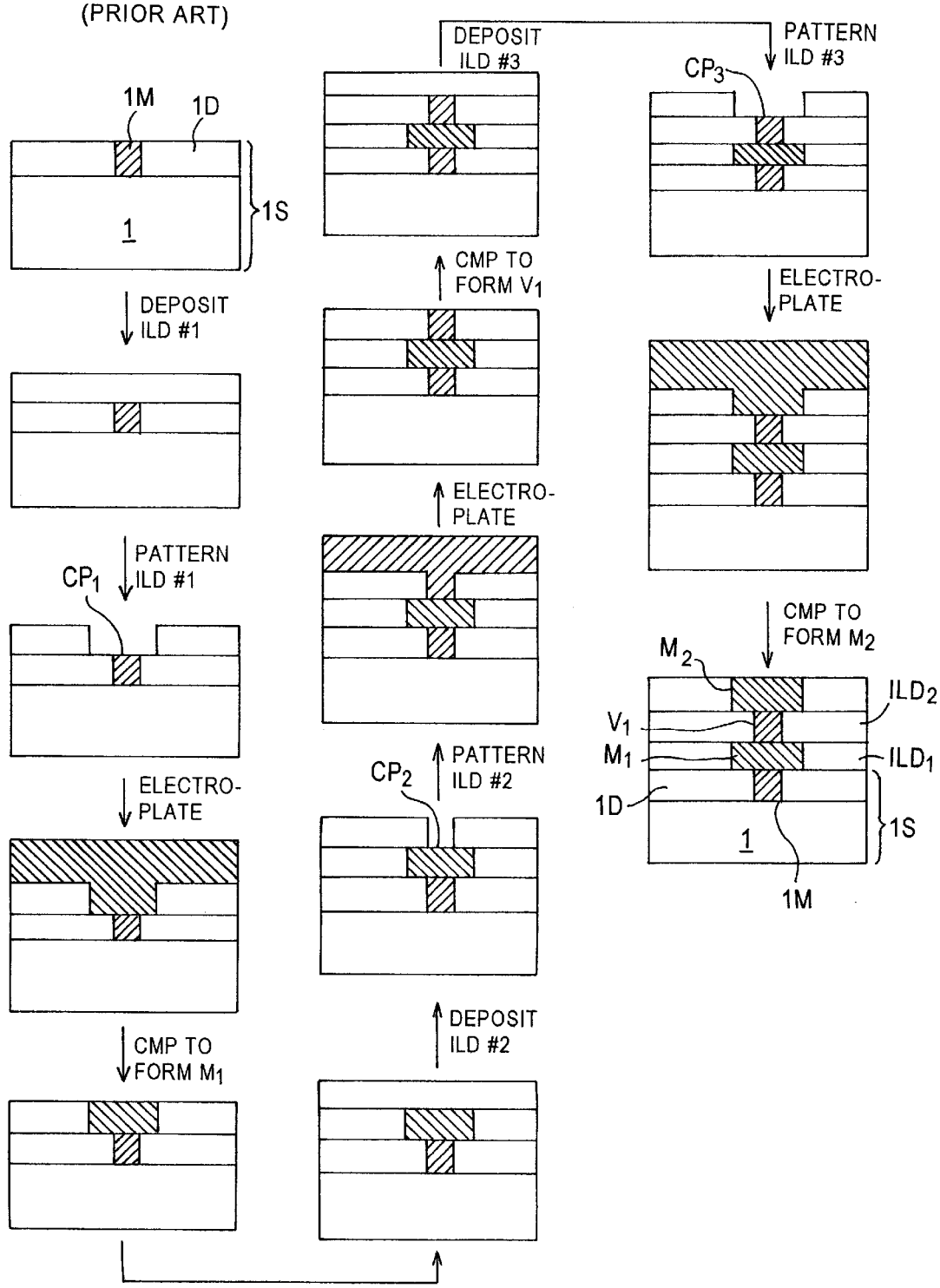
FIG. 3 illustrates, in simplified, cross-sectional schematic view, a sequence of steps for forming multilevel, Cu-based metallization processing of a semiconductor integrated circuit device according to damascene-type methodology.
Figure 4:
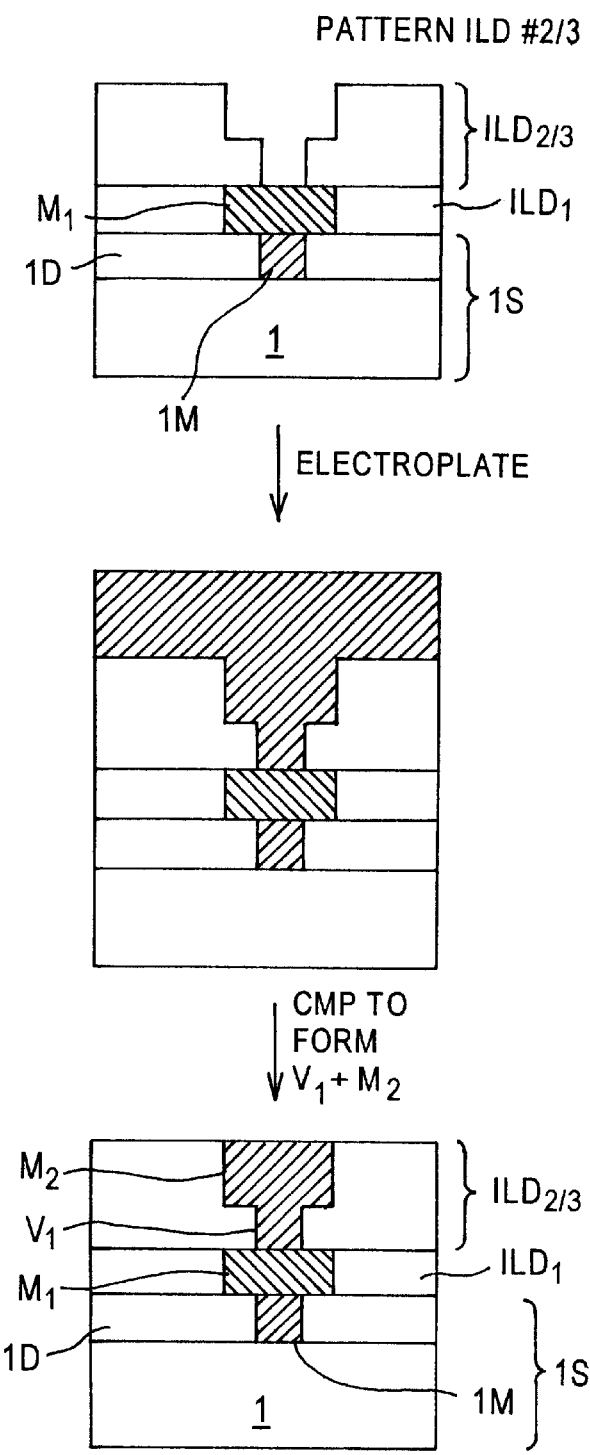
FIG. 4 illustrates, in simplified, cross-sectional schematic view, a sequence of steps for use in performing dual damascene-type metallization processing of a semiconductor integrated circuit device.
Figure 5:
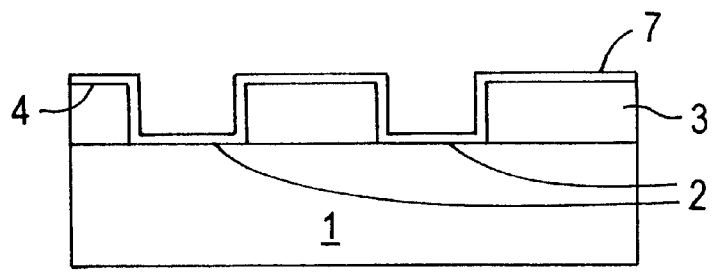
FIG. 5 illustrates, in simplified, cross-sectional schematic view, a sequence of processing steps for forming a pattern of damascene-type, in-laid Cu-based metallization features including formation of an adhesion/barrier layer, according to conventional practices for the manufacture of semiconductor integrated circuit devices.
Figure 5:
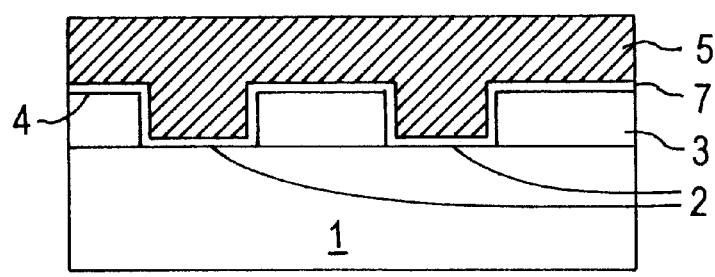
Figure 5:
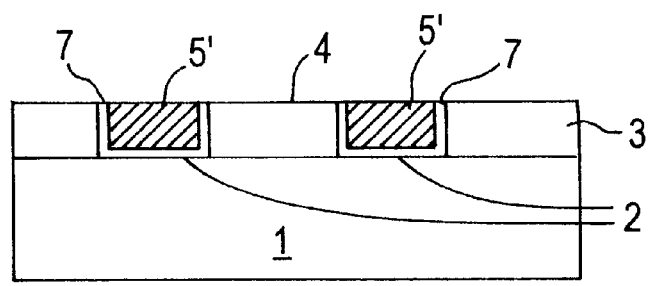
Figure 6:
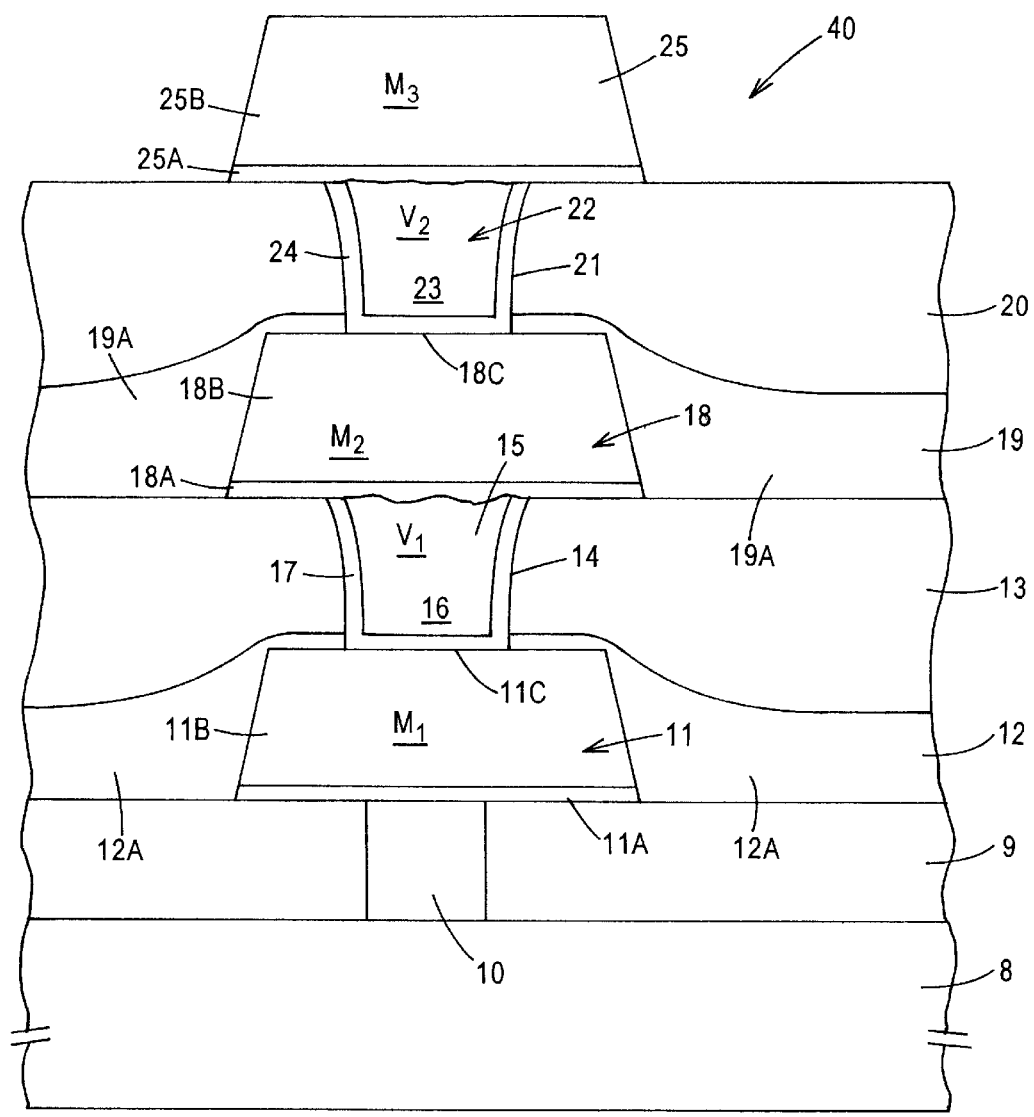
FIG. 6 schematically illustrates, in simplified cross-sectional view, a multi-metallization level semiconductor device fabricated according to subtractive etching methodology.

According to a first aspect according to the present invention, in contrast to the etching techniques conventionally employed for forming the via through-holes, trenches, and grooves in the dielectric layers according to either the damascene-type or subtractive etching-type metallization processing as described above and illustrated in the drawing, the latter are formed by use of an etching process which is fluorine-free and appropriately selected from plasma etching, reactive plasma etching, sputter etching, ion beam etching, electron beam etching, laser etching, laser ablation, and wet chemical etching. In each instance, an atmosphere, etchant, or etching environment which is free of fluorine gas, fluorine-containing gas, or fluorine-containing liquid reagents, solutes, or solvents is utilized. For example, plasma and/or reactive plasma etching of the silicon-containing dielectric materials contemplated for use herein can be performed in chlorine-containing gases; sputter etching in an inert gas, e.g., argon; ion beam etching in a vacuum or an inert gas such as argon, electron beam etching in a vacuum, laser etching or laser ablation in a vacuum or an inert gas, and wet chemical etching using non HF-based etching solutions, e.g., $H_3PO_4$-based etchants. Regardless of the particular dielectric material removal method employed for forming the via through-holes and/or other shaped recesses, deleterious contamination of an exposed surface portion (e.g., $CP_2$ or 11C of the first metallization layers of FIGS. 3 and 6, respectively) by fluorine or fluorine-containing etching residue is substantially avoided by use of any one or more of the aforementioned fluorine-free methods.

The first aspect of the present invention stems from the discovery that use of fluorine-free dielectric material removal processes for forming the through-holes constituting vias in a multi-level semiconductor device can substantially avoid the deleterious corrosive effects of fluorine or fluorine-containing residues or contaminants which are produced as a result of conventional fluorine-based device processing technology. Therefore, lower ohmic resistance, better quality, and more reliable vias and overall device structures are obtainable by the inventive method.

According to another aspect of the present invention, the apertures defining the via throughholes and metallization feature recesses, are formed by a two-step process, comprising a first step of completely forming the through-holes or other shape recesses using a conventional dielectric material removal process including fluorine or a fluorine-containing material, followed by a second, removal step of treating the thus-formed through-hole to substantially remove residual fluorine or fluorine-containing contaminant from the exposed surface portion of the electrically conductive region at the bottom of the through-hole or other shape recess. The subsequent steps of adhesion/barrier layer deposition and copper plug formation are then performed in conventional fashion, as described supra.

By way of illustration, but not limitation, the first step may be performed by a wet chemical etching process employing a fluorine-containing etchant, such as, for example, hydrofluoric acid (HF). Alternatively, a dry process, e.g., reactive plasma etching utilizing a fluorine containing gas such as, for example, $CF_4$, may be employed. The second step may utilize hydrogen plasma treatment or sputter etching in argon (Ar) for an interval sufficient to remove the fluorine or fluorine-containing contaminant(s) at the exposed surface portion of the underlying metal feature. Specific conditions and parameters for the second step will depend upon the particular method employed for the first step and can be readily determined by one of ordinary skill, given the present disclosure and objectives of the invention.

According to yet another aspect of the present invention, the apertures defining the via through-holes or other shape recesses are formed by another two-step process, comprising a first step of partial through-hole or recess formation by removing a major portion of the thickness of the dielectric material layer(s) by a conventional dielectric material removal process including fluorine or a fluorine-containing material and a second, fluorine-free step of removing the remaining minor portion of the thickness of the dielectric material layer(s) to complete through-hole or recess formation, the amount of dielectric material removed in the second step being sufficient to ensure substantially complete removal of fluorine or fluorine-containing contaminant(s) present at the bottom of the partial through-hole formed in the first step.

Illustratively, but not by way of limitation, the first, partial through-hole or recess formation step may be performed by use of a wet chemical etching process including a fluorine-containing etchant or a reactive plasma etching process employing fluorine gas or a fluorine-containing gaseous material and the second, fluorine-free step may be performed by exposing the partially formed through-hole or recess to a reactive plasma or sputter etching process using fluorine-free gases (e.g., inert gas such as argon), or to wet chemical etching using a fluorine-free etchant. In each instance, the selected etching process may utilize reactants and conditions as described above.

The present invention enjoys utility in the fabrication of various types of multi-level electrical devices such as PCBs and electronic devices such as semiconductors. Multi-level semiconductor devices formed by the improved method and aspects of the invention are substantially free of the drawbacks associated with conventional multi-level processing of Cu or Cu-based metallization schemes, i.e., substantially free of corrosion, reaction, or other degradation of the adhesion/barrier layer(s) due to residual fluorine or fluorine-containing contaminant on the underlying copper-based metal feature as a result of the use of fluorine-containing etchants or etching processing for forming through-holes for vias. Although in the illustrated embodiment, the via is shown as fully bordered for illustrative convenience, the present invention finds equivalent utility in the fabrication of devices utilizing borderless vias, such as are disclosed in U.S. Pat. No. 5,619,072, the entire disclosure of which is incorporated herein by reference.

In the previous descriptions, numerous specific details are set forth, such as specific materials, structures, reactants, processes, etc., in order to provide a thorough understanding of the present invention. However, as one having ordinary skill in the art would recognize, the present invention can be practiced without resorting to the details specifically set forth. In other instances, well-known processing structures and techniques have not been described in detail in order not to unnecessarily obscure the present invention.

Only the preferred embodiments of the invention are shown and described herein. It is to be understood that the invention is capable of use in various other combinations and environments and is capable of changes or modifications within the scope of the invention.

What is claimed is:

1. A method of manufacturing a multi-metallization level semiconductor device, which method comprises the sequential steps of:

(a) providing a substrate comprising a semiconductor body and an electrically conductive metal region at a surface of said substrate;

(b) forming a layer of a dielectric material over said substrate surface and covering said metal region;

(c) selectively forming a recess extending through said dielectric layer by use of a dielectric material removal process which is free of fluorine, said recess including interior wall surfaces and a bottom, said bottom exposing a surface portion of said electrically conductive metal region;

(d) forming an electrically conductive adhesion/barrier layer lining said interior wall surfaces and said bottom of said recess; and (e) filling said recess with an electrically conductive metal material formed over said adhesion/barrier layer and in electrical contact with said exposed surface portion of said electrically conductive metal region, thereby substantially preventing deleterious effects on the adhesion/barrier layer due to presence of fluorine or fluorine-containing contaminant(s) at said exposed surface portion.

2. The method as in claim 1, wherein step (b) comprises forming said layer of dielectric material from a member selected from the group consisting of silicon oxides, silicon nitrides, and silicon oxynitrides.

3. The method as in claim 2, wherein step (c) comprises selectively forming said recess in said dielectric material layer by a fluorine-free process selected from the group consisting of plasma etching, reactive plasma etching, sputter etching, ion beam etching, electron beam etching, laser etching, laser ablation, and wet chemical etching.

4. The method as in claim 3, wherein step (a) comprises providing a said substrate wherein said electrically conductive metal region comprises copper or a copper alloy, and step (e) comprises filling said recess with copper or a copper-based alloy.

5. The method as in claim 4, wherein step (d) comprises forming said electrically conductive adhesion/barrier layer from a material chosen from the group consisting of chromium, tantalum, and tantalum-based compounds or alloys.

6. The method as in claim 5, wherein step (c) comprises forming said recess as a via hole for electrically interconnecting vertically spaced-apart metallization levels of said semiconductor device.

7. The method as in claim 6, wherein steps (b)–(e) form part of a damascene, in-laid metallization process or a subtractive etching metallization process and are repeated, as necessary, for providing a semiconductor device having multiple metallization levels.

\* \* \* \* \*